United States Patent [19]
Chen

[11] Patent Number: 6,008,513
[45] Date of Patent: Dec. 28, 1999

[54] DYNAMIC RANDOM ACCESS MEMORY (DRAM) CELLS WITH MINIMUM ACTIVE CELL AREAS USING SIDEWALL-SPACE BIT LINES

[75] Inventor: Li Yeat Chen, Hsinchu, Taiwan

[73] Assignee: Vanguard International Semiconductor Corporation, Hsin-Chu, Taiwan

[21] Appl. No.: 09/196,750

[22] Filed: Nov. 20, 1998

Related U.S. Application Data

[62] Division of application No. 09/106,332, Jun. 29, 1998, Pat. No. 5,858,829.
[51] Int. Cl.$^6$ .......................... H01L 27/108; H01L 29/76; H01L 29/94; H01L 31/119
[52] U.S. Cl. ............................................. 257/296; 257/301
[58] Field of Search ...................................... 257/296, 301

[56] References Cited

U.S. PATENT DOCUMENTS

| | | |
|---|---|---|
| 5,138,412 | 8/1992 | Hieda et al. . |
| 5,281,837 | 1/1994 | Kohyama . |
| 5,409,855 | 4/1995 | Jun ............................................. 437/52 |
| 5,482,886 | 1/1996 | Park et al. ................................. 437/60 |
| 5,622,883 | 4/1997 | Kim ......................................... 438/396 |

Primary Examiner—Stephen D. Meier
Attorney, Agent, or Firm—George O. Saile; Stephen B. Ackerman

[57] ABSTRACT

A method for making DRAM cells with minimum active device areas (cell areas) using novel sidewall-spacer bit lines is achieved. A trench is etched in an insulating layer aligned over the device areas and orthogonal to the gate electrodes, and extending over the first and second source/drain areas. A conducting layer is deposited and etched back to form sidewall-spacer bit lines. A planar second insulating layer is formed in which bit line contact openings are etched between the sidewall-spacer bit lines to the first source/drain areas. The contact openings are filled with a third conducting layer to form the bit line contacts. A third insulating layer is deposited and capacitor node contact openings are etched between the sidewall-spacer bit lines and to the second source/drain areas. An insulating layer is deposited and etched back to insulate the sidewall-spacer bit lines in the node contact openings and a fourth con-ducting layer is deposited and etched back to form the node contacts. By this self-aligned method, the minimum unit cell area (device area) can be reduced to about $6F^2$, where F is the minimum feature size for the current technology. Any one of the current stacked capacitor structures, such as crown, fin-shaped, and the Like, can now be built on the node contacts to provide memory cells with increased packing density.

6 Claims, 10 Drawing Sheets

DYNAMIC RANDOM ACCESS MEMORY (DRAM) CELLS WITH MINIMUM ACTIVE CELL AREAS USING SIDEWALL-SPACE BIT LINES

This is a division of patent application Ser. No. 09/106,332, filing date Jun. 29, 1998 now U.S. Pat. No. 5,858,829 A New Method For Fabricating Dynamic Random Access Memory (Dram) Cells With Minimum Active Cell Areas Using Sidewall-Spacer Bit Lines, assigned to the same assignee as the present invention.

BACKGROUND OF THE INVENTION

(1) Field of the Invention

This invention relates to an integrated circuit semiconductor device, and more particularly to a method for fabricating an array of memory cells with minimum cell area that are difficult to achieve in the prior art. The method forms a split bit-line structure using electrically conductive sidewall spacers (as bit lines) which allows for improved self-alignment between bit lines and capacitor node contacts, and thereby reduce the memory cell area.

(2) Description of the Prior Art

In recent years the number and density of memory cells on the DRAM chip have dramatically increased. The DRAM chip areas on the substrate consist of an array of closely spaced memory cells with address and read/write circuits along the periphery of the chip. Currently in production there are 64 million memory cells on a DRAM chip with minimum feature sizes less than a half micrometer. The individual DRAM cells are formed from a single access transistor, typically a field effect transistor (FET), and a storage capacitor with a node contact to one of the two source/drain areas of the FET. The capacitor is used for storing information in binary form (0's and 1's) as electrical charge, and the second source/drain area is connected to a bit line that is used to read and write information via peripheral circuits on the DRAM chip. Word lines that also form the FET gate electrodes over the active device are (cell areas) are used to randomly access the individual memory cells.

By the year 2000 the number of memory cells on a DRAM chip is expected to reach 1 Gigabit. This increase in circuit density has resulted from the downsizing of the individual semiconductor devices (FETs) and the resulting increase in device packing density. The reduction in device minimum feature size F is due in part to advances in high resolution photolithography and directional (anisotropic) plasma etching. For example, the minimum feature size F is expected to be 0.25 to 0.18 micrometer (um) for the next product generation. However, it is becoming increasingly difficult to further reduce the unit memory cell size on DRAMs.

Figure 1A:
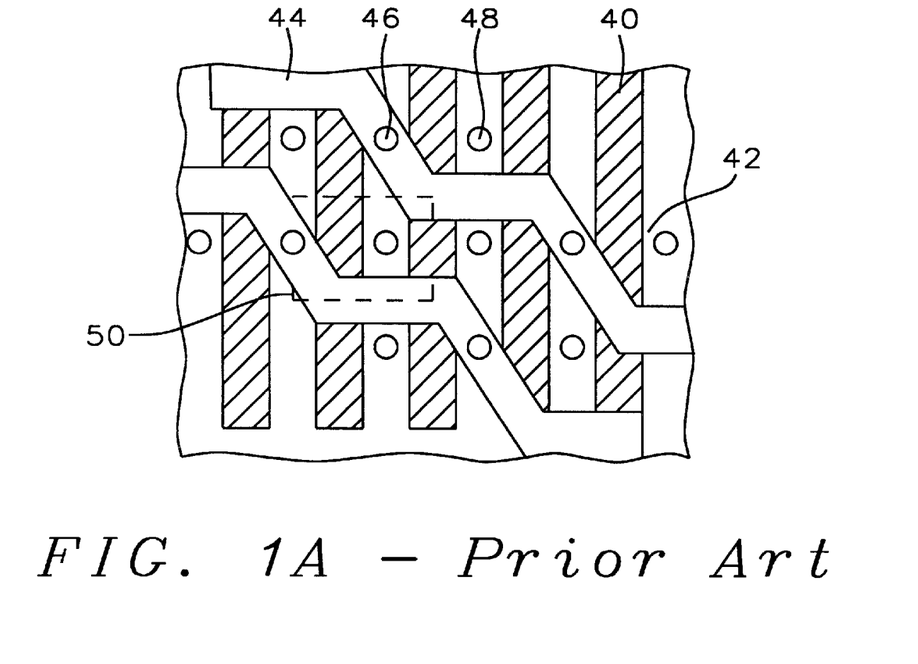
FIG. 1A is a schematic top view showing a prior-art diagonal bit line cell layout for a DRAM device having a $6F^2$ cell area.
Figure 1B:
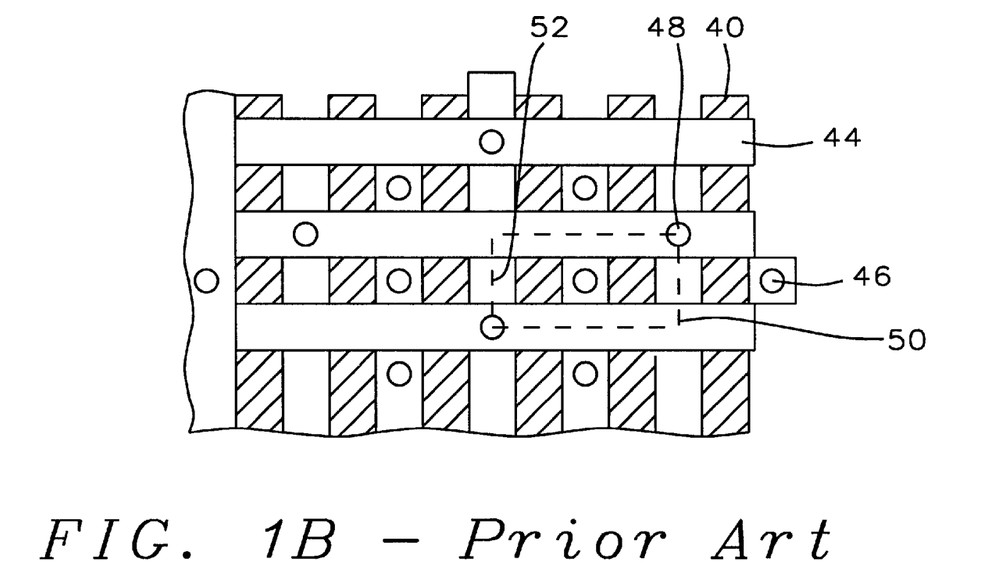
FIG. 1B is a schematic top view showing a prior-art art folded bit line COB cell layout for a DRAM device having an $8F^2$ cell area.

This problem is best understood by considering the design layout of the memory cells as shown in FIGS. 1A and 1B of the prior art for two conventional layouts. Shown in FIG. 1A is a top view depicting the layout for a conventional diagonal bit-line (DBL) memory cell design. The layout consist of an array of word lines 40 extending over the active device regions 42 to form the FETs. The bit lines 44 extend diagonally over the bit line contacts 46 to one of the two source/drain areas of each FET, while the capacitor node contact 48 is formed to the second source/drain area. The dashed line 50 in FIG. 1A shows one of the enclosed unit memory cell area. In terms of minimum feature size F, the unit cell area is 2F×3F=6F$^2$. In FIG. 1B is shown a second layout for a conventional folded bit line cell array. The corresponding elements are similarly labeled as in FIG. 1A. In this layout the unit cell indicated by the dashed line 52 requires a cell area of 2F×4F=8F$^2$, and as is clearly seen, requires a larger cell area. In either case, since the mode contact 48 and the bit line 44 lie in the same plain on the chip, it becomes increasingly difficult to make reliable DRAM devices because of photolithographic alignment tolerances and the reduction in minimum feature size F for future product.

Several methods for making DRAM cells with stacked capacitors have been described in the literature. More specifically, Park et al., in U.S. Pat. No. 5,482,886, describe a method for making DRAM capacitors using sidewall spacers in the node contact opening. Another method is described by Kim, U.S. Pat. No. 5,622,883, for making DRAM cells using landing pads for both the bit line and capacitor node contacts. Also in the prior art of the same reference, a method is described for making capacitor node contacts using sidewall spacers. Still another method is described in U.S. Pat. No. 5,409,855 to Jun for making semiconductor devices having capacitors, in which the capacitance is increased while reducing the height difference between the memory cell area and surrounding area on the chip. However, none of the above addresses the problem in reducing the unit cell area.

Therefore there is still a need in the industry to provide a process that forms improved self-aligned node contacts to bit lines for capacitor-over-bit line (COB) DRAM structures with reduced cell areas.

SUMMARY OF THE INVENTION

It is a principal object of the present invention to form memory cells with minimum cell area using improved self-aligned capacitor node contacts to bit lines as minimum feature sizes F decrease.

It is another object of the present invention to form these self-aligned node-contact-to-bit-line structures with less dependence on photolithographic alignment tolerance, therefore relaxing the design rules for photoresist alignment and etching.

It is still another object of this invention to form these improved self-aligned node-contact-to-bit-line structures using a novel split bit line structure formed from electrically conducting sidewall spacers.

In accordance with the present invention a method and a structure are provided that use split bit lines to minimize the active device area necessary for making DRAM cells. These split bit lines (also referred to as sidewall-spacer bit lines) are formed by using conducting sidewall spacers. This allows the capacitor node contacts to be formed between the sidewall-spacer bit lines and are self-aligned to the bit lines. This results in tighter design ground rules and minimizes the photolithographic misalignment problem.

The method begins by providing a semiconductor substrate. Typically the substrate is a P$^-$ doped single-crystal silicon substrate having a <100> crystallographic orientation. Device areas are provided by forming a relatively thick Field OXide (FOX) that surrounds and electrically isolates each device area in and on the substrate. These device areas on DRAM chips which include the memory cell areas can be designed having reduced area, as will become apparent later in the process description. The conventional method of forming the field oxide is by the local oxidation of silicon (LOCOS) in which an oxidation barrier layer, such as silicon nitride (Si$_3$N$_4$), is patterned to leave portion over the device areas and then the exposed substrate is oxidized to the desired oxide thickness to form the FOX. Other methods of forming the field oxide, such shallow trench isolation (STI) can be used in which trenches are etched in the substrate and filled with a chemical vapor deposited (CVD) oxide that is made planar with the substrate surface. The FETs are formed by first growing a thin gate oxide on the device areas. A first electrically conducting layer is deposited and patterned to form the FET gate electrodes on the device areas and concurrently form word lines over the field oxide areas. Typically the conducting layer is a polycide layer consisting of a heavily $N^+$ doped polysilicon layer with a silicide layer, such as tungsten silicide ($WSi_2$) on the top surface. A cap oxide and/or silicon nitride is deposited and the cap oxide layer and the conducting layer are patterned to form the gate electrodes. For submicron FET structures, lightly doped source/drain areas are formed by ion implanting, and insulating sidewall spacers are formed on the gate electrodes to improve the device characteristics, such as minimizing short-channel effects. First and second source/drain contact areas are then formed in each of the memory cell areas for the FET, for example by ion implanting an N type dopant, such as phosphorus ions ($p^{31}$), adjacent to the FET gate electrodes.

The method of this invention for making memory cells having minimum memory cell areas continues by depositing and planarizing a first insulating layer on the substrate. Trenches are etched in the first insulating layer aligned over and orthogonal to the gate electrodes and aligned and extending over the first and second source/drain areas using a photoresist mask and anisotropically plasma etching. A conformal second conducting layer is deposited on the first insulating layer and in the trenches and is anisotropically etched back to form sidewall-spacer bit lines on the sidewalls in the trenches. A second insulating layer is deposited sufficiently thick to fill the trenches between the sidewall-spacer bit lines and provides a planar surface. Openings are anisotropically plasma etched in the second and first insulating layers aligned over and between the sidewall-spacer bit lines, and are etched to the first source/drain areas in each of the memory cell areas. A third conducting layer is deposited to fill the bit line contact openings. The third conducting layer is then chemically/mechanically polished or etched back to the surface of the second insulating layer to form bit line contacts to the first source/drain areas and making electrical contact to the sidewall-spacer bit lines exposed in the bit line contact openings. A third insulating layer, such as a borophosphosilicate glass (BPSG), is deposited and annealed to form a planarized layer. Openings are anisotropically etched in the third, second, and first insulating layers. The openings are aligned over and between the sidewall-spacer bit lines and to the second source/drain areas to form the capacitor node contact openings. A thin conformal fourth insulating layer, such as $Si_3N_4$, is deposited in the node contact openings and is anisotropically etched back to form insulating sidewalls on any exposed sidewall-spacer bit lines in the node contact openings. A fourth conducting layer is deposited to fill the node contact openings to form node contacts to the second source/drain areas. Because of the self-aligning technique of this invention, the area of the memory cell can be reduced and the packing density for the memory cells can be increased. The DRAM memory cells are now completed by forming stacked capacitors over the node contacts.

BRIEF DESCRIPTION OF THE DRAWINGS

The objects and advantages of this invention are best understood with reference to the attached drawings in the figures and the embodiment that follows.

FIGS. 3A through 7D show schematic cross-sectional views for the sequence of process steps for fabricating the novel DRAM cells by the method of this invention.

DESCRIPTION OF THE PREFERRED EMBODIMENT

Figure 2:
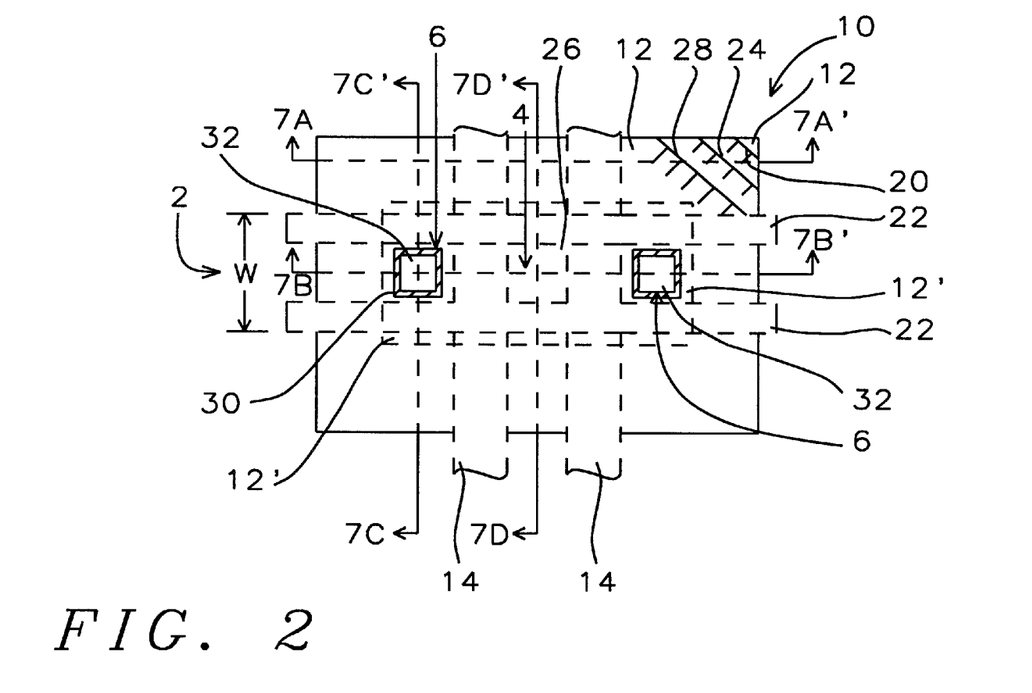
FIG. 2 shows a schematic top view for this invention of a layout of two adjacent memory cells having a common bit line contact and a sidewall-spacer bit line.

Referring now to the top view of FIG. 2 and the cross-sectional views in FIGS. 3A through 7D, the embodiment of this invention is described in detail. The cross sections in FIGS. 3A through 7D relate to the corresponding cross sections A–A', B–B', C–C', and D–D' in FIG. 2. The invention uses a novel sidewall-spacer bit-line structure to make memory cell for DRAM devices having reduced cell areas. Although the process is described for making memory cells for DRAM devices having N-channel FETs as the access transistors, it should also be well understood by one skilled in the art that by including additional process steps, in addition to those described in this embodiment, other types of devices can be included on the DRAM chip. For example, by forming N-well regions in a P-doped substrate, P-channel FETs can also be provided from which can be formed Complementary Metal-Oxide-Semiconductor (CMOS) circuits required for the peripheral circuits on the DRAM chip.

To better appreciate this novel cell structure and the sequence of process steps as depicted in FIGS. 3A through 7D, a top view of two adjacent memory cells having a common bit-line contact is described with reference to FIG. 2. The top view of FIG. 2 shows a substrate 10 having field oxide regions 12 surrounding and electrically isolating device areas 12'. A first conducting layer is patterned to form word lines 14 that extending over the device areas 12' to form FET gate electrodes, also labeled 14. A planar first insulating layer 20 is formed over the word lines 14. Trenches 2, having width W, are etched in layer 20 over the device areas 12' and diagonal to the word lines 14. A conformal second conducting layer is deposited and anisotropically etched back to form sidewall-spacer bit lines 22 on the sidewalls of the trenches 2. A conformal second insulating layer 24 is deposited to a thickness sufficient to fill the trenches 2 between the sidewall-spacer bit lines 22. Bit-line contact openings 4 are anisotropically etched in insulating layers 24 and 20 to a first source/drain area of each FET. The bit-line contact opening in FIG. 2 is to a common source/drain area between the gate electrodes 14 for two adjacent FETs. A third conducting layer is deposited to fill the bit-line contact openings 4 and is etched back to form the bit-line contacts 26. A third insulating layer 28 is deposited over and insulating the bit-line contacts 26. Node contact openings 6 are then etched in the insulating layers 28, 24, and 20, over the trench area 2 between the sidewall-spacer bit lines 22, to the second source/drain area of each FET. A thin conformal fourth insulating layer 30 is deposited and etched back to insulate the exposed sidewall-spacer bit lines 22 in the node contact openings 6. A conformal fourth conducting layer is deposited to fill the node contact openings 6, and is etched back to the third insulating layer 28 to form the node contacts 32. Stacked capacitors of choice are then formed over the capacitor node contacts 32 to complete the dynamic random access memory (DRAM) cells having this reduced cell area. The stacked capacitors are not shown in the top view of FIG. 2 to simplify the drawing.

Figures 3A, 3B:
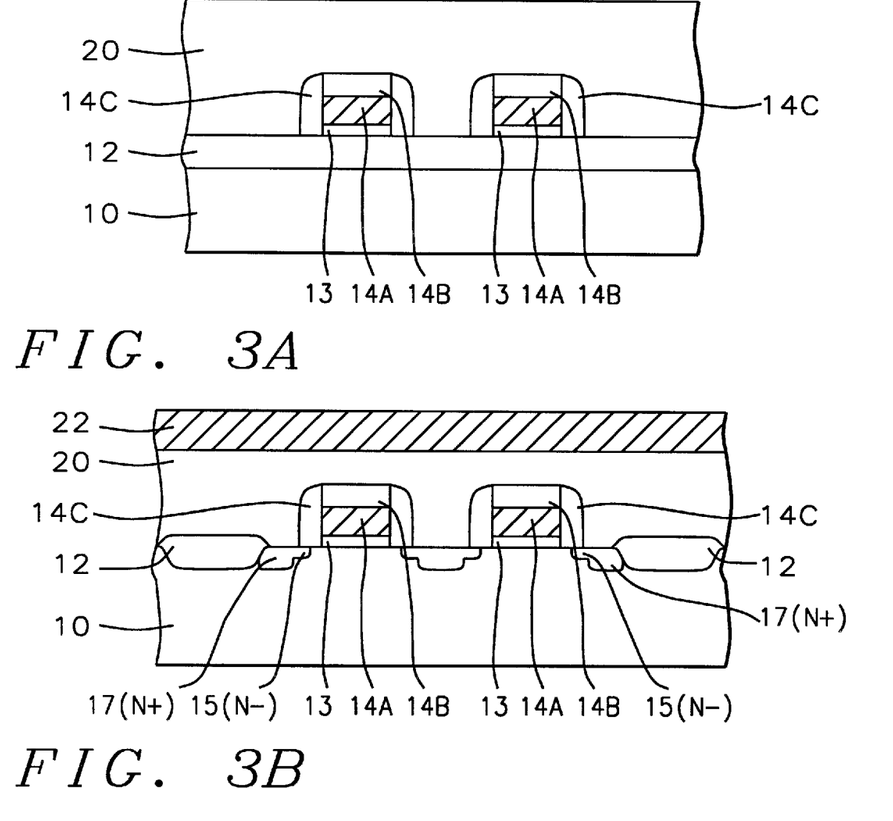

Referring now to FIGS. 3A through 3D, the method begins by providing a semiconductor substrate 10, as shown in FIG. 3A. Typically the substrate is a $P^-$ doped single-crystal silicon substrate having a <100> crystallographic orientation. A Field OXide (FOX) 12 is formed surrounding and electrically isolating each device area in and on the substrate 10. The field oxide is typically formed by the local oxidation of silicon (LOCOS) in which an oxidation barrier layer (not shown), such as silicon nitride ($Si_3N_4$), is patterned over the device areas and then the exposed substrate 10 is then oxidized. Typically the FOX 12 is grown to a thickness of between about 1200 and 4000 Angstroms. Other methods of forming the field oxide, such shallow trench isolation (STI), can also be used, but for the purpose of this invention the LOCOS method is used. The FETs are formed by first forming a thin gate oxide 13 on the device areas, as shown in FIG. 3B. Typically the gate oxide is formed by thermal oxidation and is grown to a thickness of between about 30 and 120 Angstroms. A first electrically conducting layer 14A is deposited and patterned to form the FET gate electrodes 14 on the device areas and concurrently to form word lines (not shown) over the field oxide areas 12. Typically the conducting layer 14A is a polycide layer consisting of a heavily N+doped polysilicon layer with a silicide layer, such as tungsten silicide ($WSi_2$), on the top surface. The polysilicon can be deposited by low pressure chemical vapor deposition (LPCVD) using silane ($SiH_4$) and is conductively doped N type with phosphorus (P). The $WSi_2$ is deposited by CVD using tungsten hexafluoride ($WF_6$) and $SiH_4$ as the reactant gases. Polycide layer 14A is deposited to a total thickness of between about 1000 and 3000 Angstroms. A cap oxide layer 14B, composed of silicon oxide ($SiO_2$) and/or $Si_3N_4$, is deposited over the conducting layer 14A before patterning the FET gate electrodes 14. Lightly doped source/drain areas 15($N^-$) are formed by ion implanting an N type dopant such as phosphorus (P) to minimize the short-channel effects, as commonly practiced in the industry, and is also depicted in FIG. 3B. Then insulating sidewall spacers 14C are formed on the gate electrodes 14. Source/drain contact areas 17($N^+$) are formed in each of the device areas, for example by ion implanting an N type dopant, such as phosphorus ions ($p^{31}$), adjacent to the FET gate electrodes 14 to provide good ohmic contacts.

More specifically, the method and structure for making memory cells that allow the cell area to be reduced (for example, having an active area (AA) of $6F^2$, where F is the minimum feature size) is now described. A first insulating layer 20 is deposited. Layer 20 is preferably a $SiO_2$ and is deposited by LPCVD using tetraethosiloxane (TEOS) as the reactant gas. Layer 20 is then planarized, for example by chemical/mechanical polishing. The preferred thickness of layer 20 over the gate electrodes 14 after planarization is between about 3000 and 6000 Angstroms.

Figure 3C:
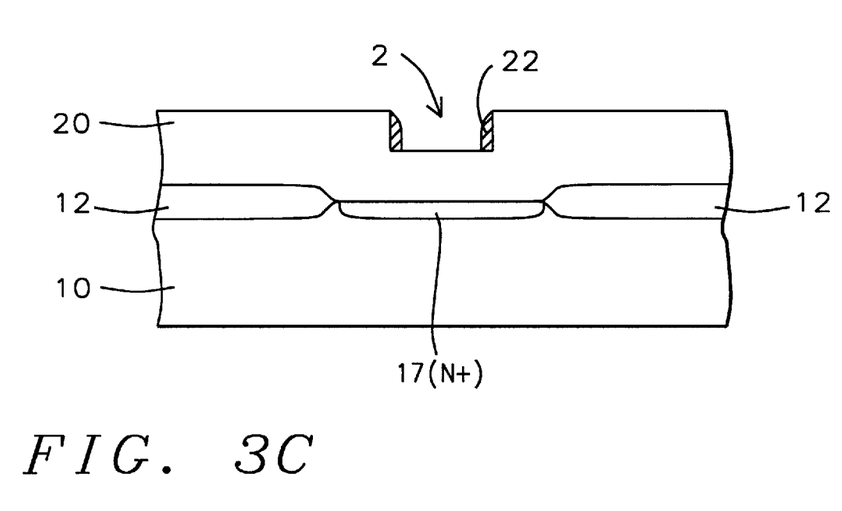
Figure 3D:
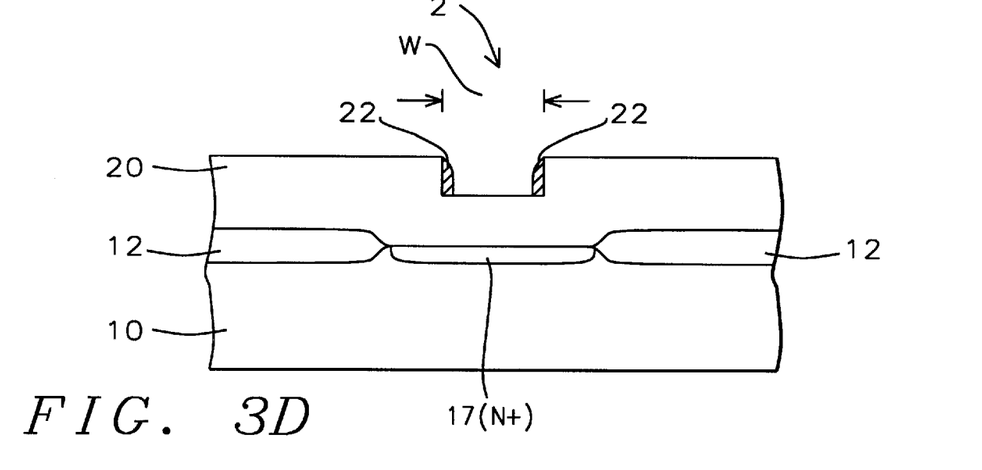

A key feature of this invention, trenches 2 are etched in the first insulating layer 20, as shown in FIGS. 3C and 3D for the cross sections through C–C' and D–D', respectively, as shown in FIG. 2. The trenches 2 are aligned over and orthogonal to the gate electrodes 14 and aligned and extending over the source/drain contact areas 17($N^+$). Conventional photolithographic techniques and anisotropic plasma etching are used to etch the trenches. For example, the trenches 2 can be etched using reactive ion etching (RIE) and an etchant gas such as carbon tetrafluoride ($CF_4$). The trenches are etched to a preferred depth of between about 500 and 2000 Angstroms, and having a width W equal to 2F.

Next, a conformal second conducting layer 22 is deposited on the first insulating layer 20 and in the trenches 2. The second conducting layer is preferably polysilicon deposited by LPCVD using $SiH_4$ as the reactant gas, and is in-situ doped $N^+$ with phosphorus, for example using phosphine ($PH_3$) as the dopant gas. Layer 22 is doped to a concentration of between about 1.0 E 19 and 1.0 E 21 atoms/$cm^3$. Layer 22 is deposited to a thickness of between about 600 and 1600 Angstroms. The polysilicon layer 22 is then anisotropically etched back to form sidewall-spacer bit lines, also labeled 22, on the sidewalls in the trenches 2, as shown in FIGS. 3C and 3D. The sidewall-spacer bit lines 22 are also depicted in FIG. 3B for the cross section B–B' along the trench 2 in FIG. 2.

Figure 4A:
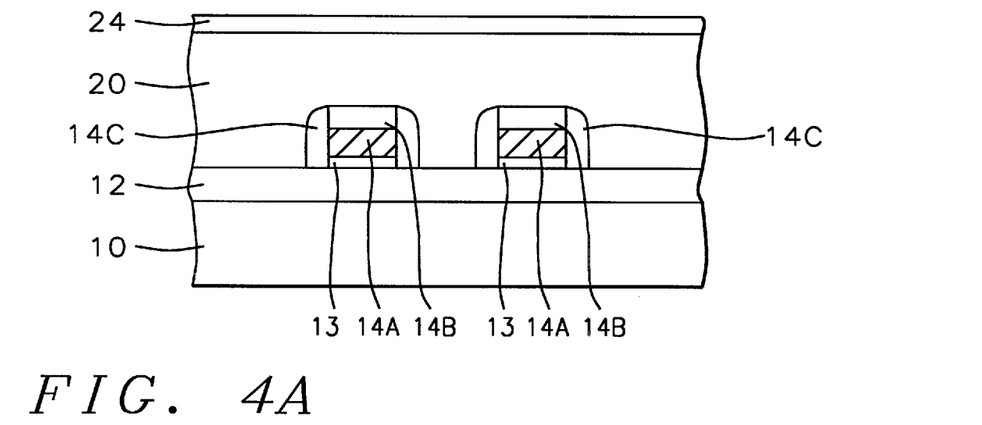
Figure 4B:
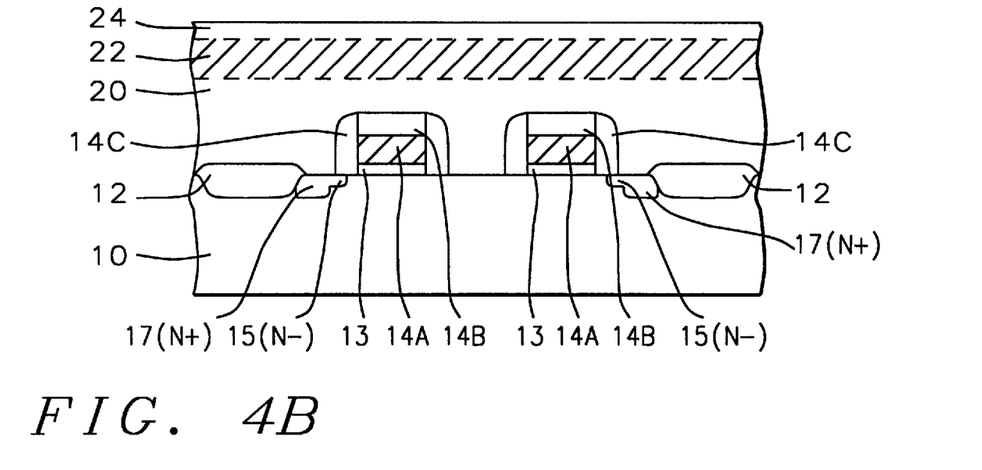
Figure 4C:
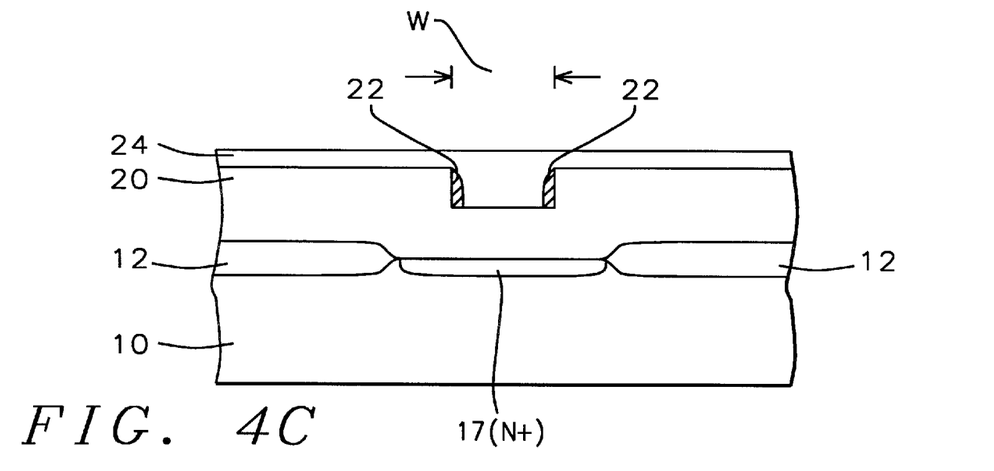
Figure 4D:
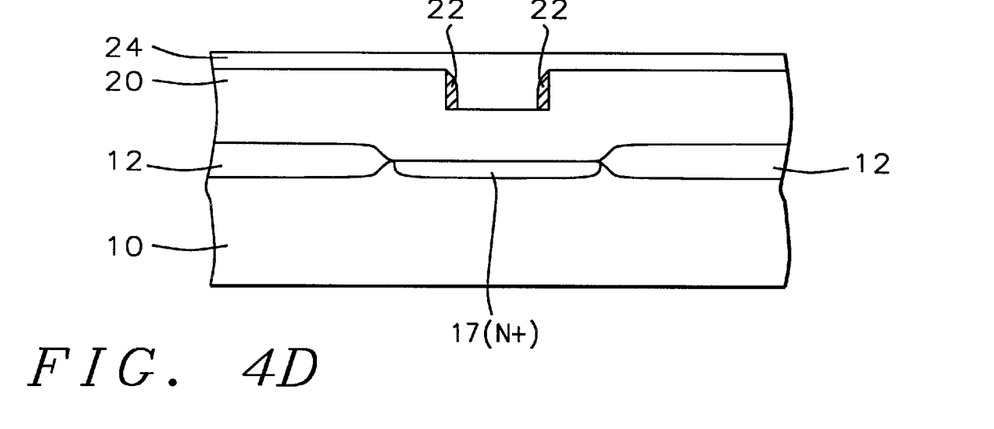

The next process step is shown in FIGS. 4A through 4D. A second insulating layer 24 is deposited as shown in FIG. 4A. The second insulating layer 24 is deposited to a thickness sufficient to fill the trenches 2 between the sidewall-spacer bit lines 22, as shown in FIGS. 4C and 4D for the corresponding cross sections C–C' and D–D' in FIG. 2. Layer 24 is preferably a borophosphosilicate glass (BPSG), deposited by CVD using TEOS and appropriate boron and phosphorus dopant gases. The second insulating layer 24 is deposited to a thickness at least greater than W/2, and is annealed to reflow the BPSG layer and is chemically/mechanically polished to provide a planar topography. More specifically, for the next generation technology having minimum feature sizes F of about 0.18 micrometers (um) or 0.25 um, the trench 2 having a width W of 2F would require a layer 24 having a thickness of at least 0.25 um (2500 Angstroms). Alternatively, layer 24 can be a spin-on glass (SOG) that is thermally cured to provide a $SiO_2$ having a planar surface. The structure for the cross section B–B' of FIG. 2 is depicted in FIG. 4B, showing one of the two sidewall-spacer bit lines 22 depicted as a dashed line because it is recessed behind layer 24.

Figure 5A:
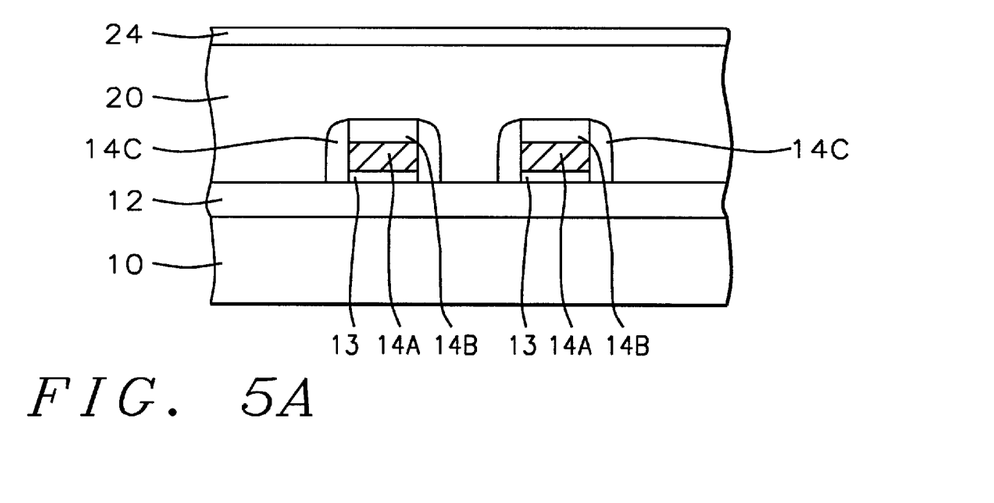
Figure 5B:
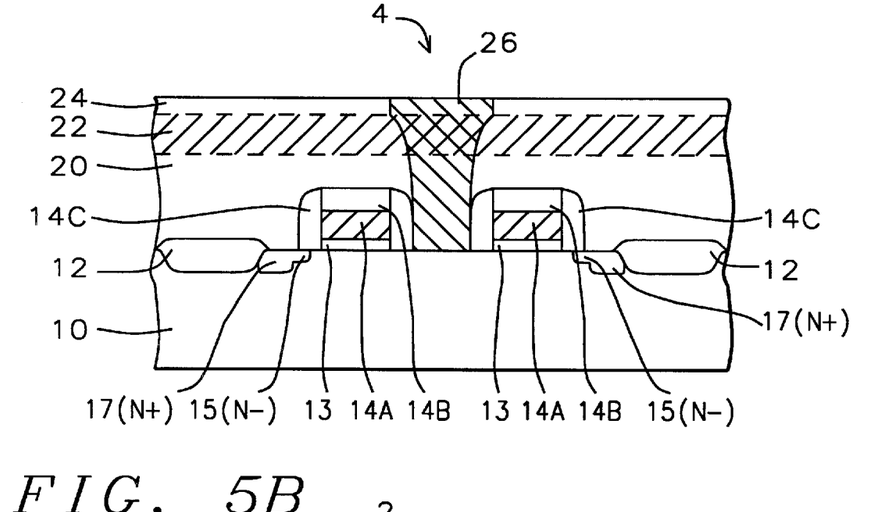
Figure 5C:
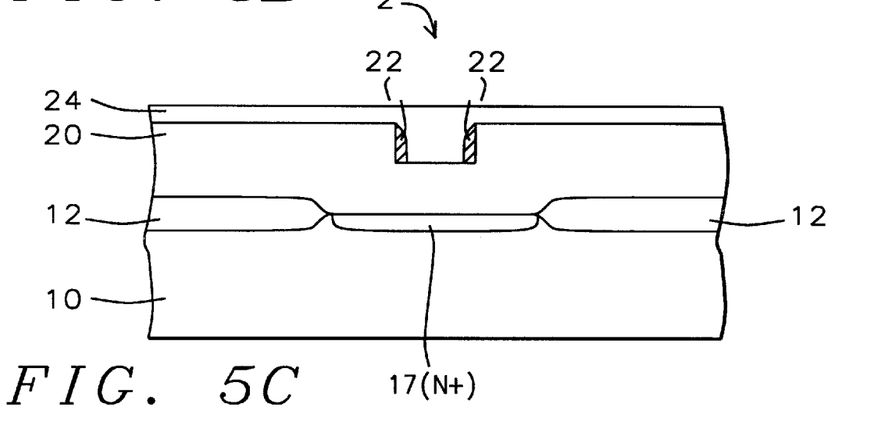
Figure 5D:
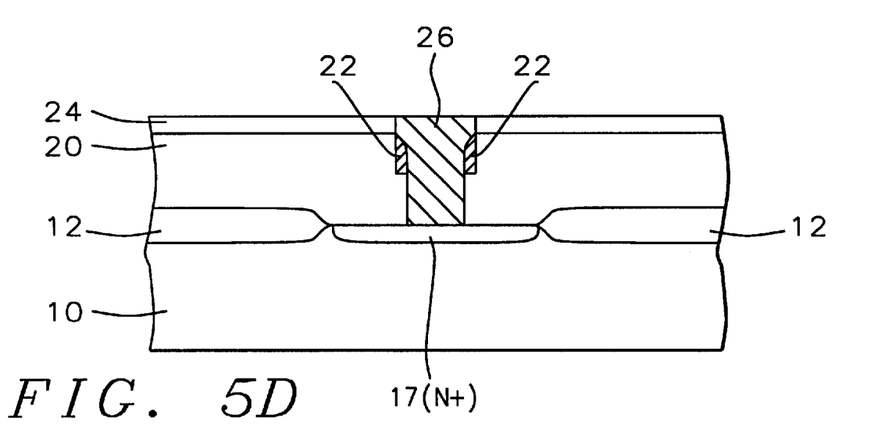

Referring to FIGS. 5A through 5D, contact openings 4 are etched to form the bit-line contacts. Conventional photolithographic techniques and anisotropic plasma etching are used to etch contact openings 4 in the second and first insulating layers 24 and 20, as shown in FIGS. 5B and 5D. The contact openings 4 are aligned over and between the sidewall-spacer bit lines 22, and are etched to the first of the source/drain areas 17($N^+$) in each of the memory cell areas. The openings are preferably etched using high-density plasma (HDP) etching having a high etch-rate selectivity of oxide to silicon. For example, the plasma etching can be carried out using trifluoromethane ($CHF_3$).

Figure 6A:
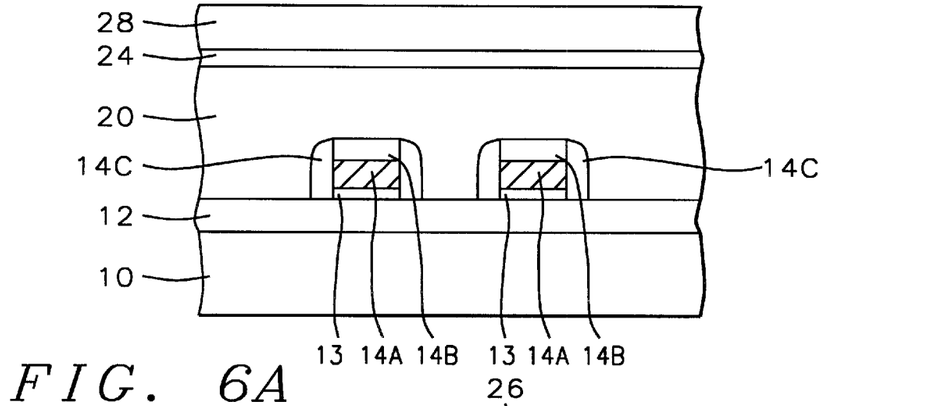
Figure 6B:
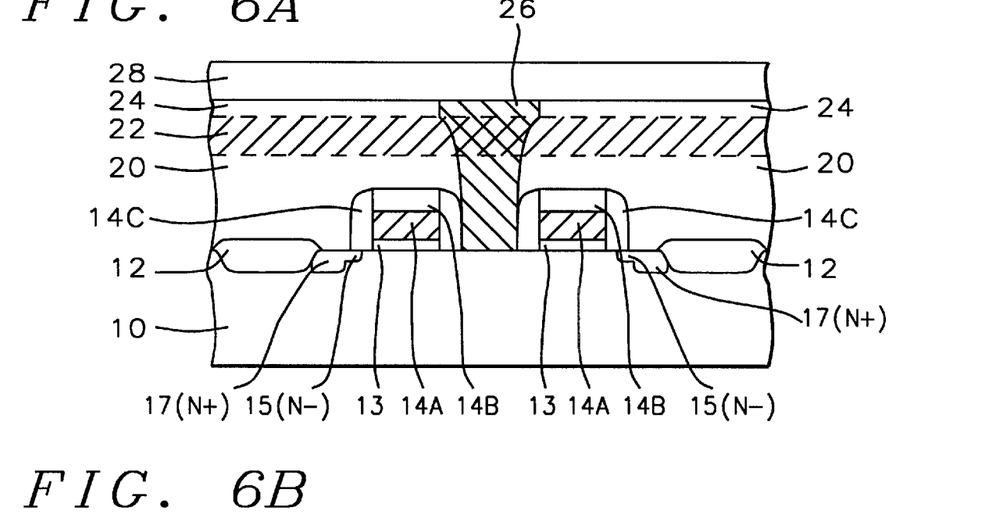
Figure 6C:
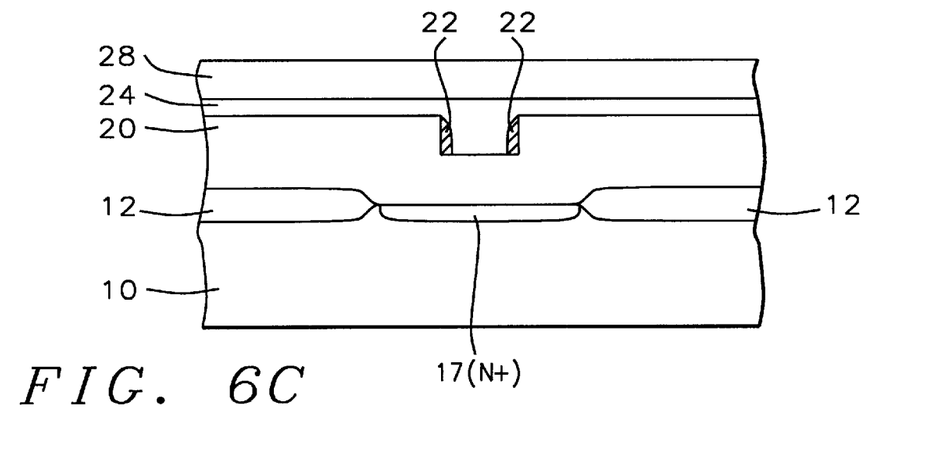
Figure 6D:
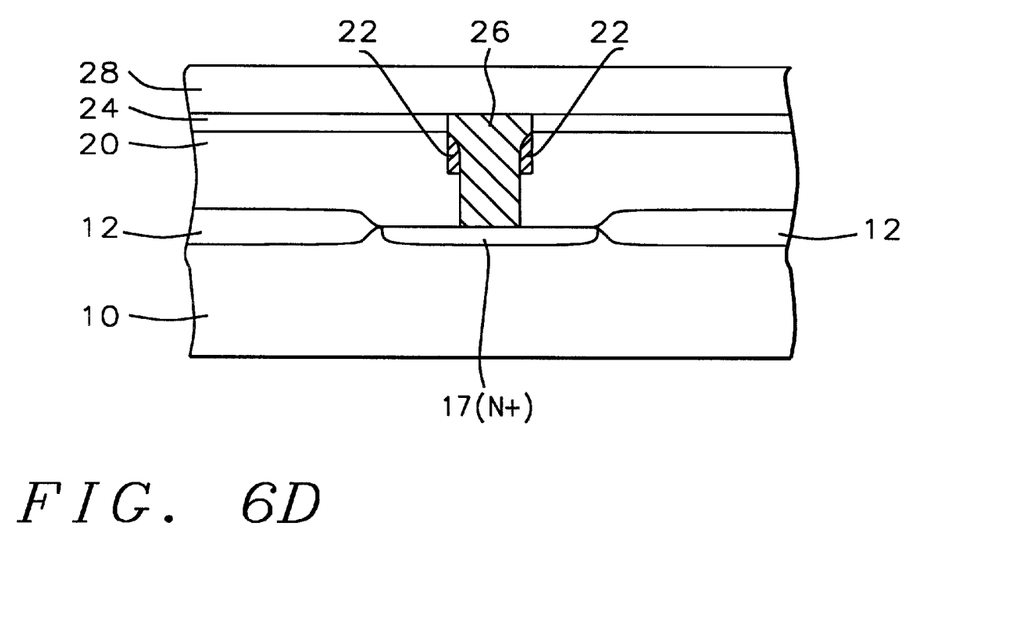

A third conducting layer 26 is deposited to fill the bit-line contact openings 4, as shown in FIGS. 5B and 5D. Layer 26 is preferably composed of a heavily $N^+$ doped polysilicon. Layer 26 can be deposited by LPCVD using $SiH_4$ as the reactant gas, and is in-situ doped using $PH_3$ as the dopant gas, and is doped to a concentration of between about 1.0 E 19 and 1.0 E 21 atoms/$cm^3$. Layer 26 is deposited to a thickness sufficient to fill the bit-line contact openings 4. The third conducting layer 26 is then chemically/mechanically polished or etched back to the surface of the second insulating layer 24 to form bit line contacts, also labeled 26, to the first of the source/drain contact areas 17($N^+$) and making electrical contact to the sidewall-spacer bit lines 22 exposed in the bit-line contact openings 4, as shown in FIGS. 5B and 5D Referring next to FIGS. 6A through 6D, a third insulating layer 28 is deposited over the bit-line contacts 26, as shown in FIGS. 6B and 6D. Layer 28 is preferably a BPSG, and is annealed to flow the BPSG and to planarize the surface. Preferably layer 28 is deposited by CVD using $SiH_4$ as the reactant gas, and doped with appropriate boron and phosphorus dopants. The thickness of layer 28 is between about 500 and 3000 Angstroms. Alternatively, layer 28 can include a barrier layer composed of $Si_3N_4$, and is depicted in FIGS. 6A through 6D as part of layer 28. The barrier layer is deposited to a preferred thickness of between about 60 and 200 Angstroms.

Figure 7A:
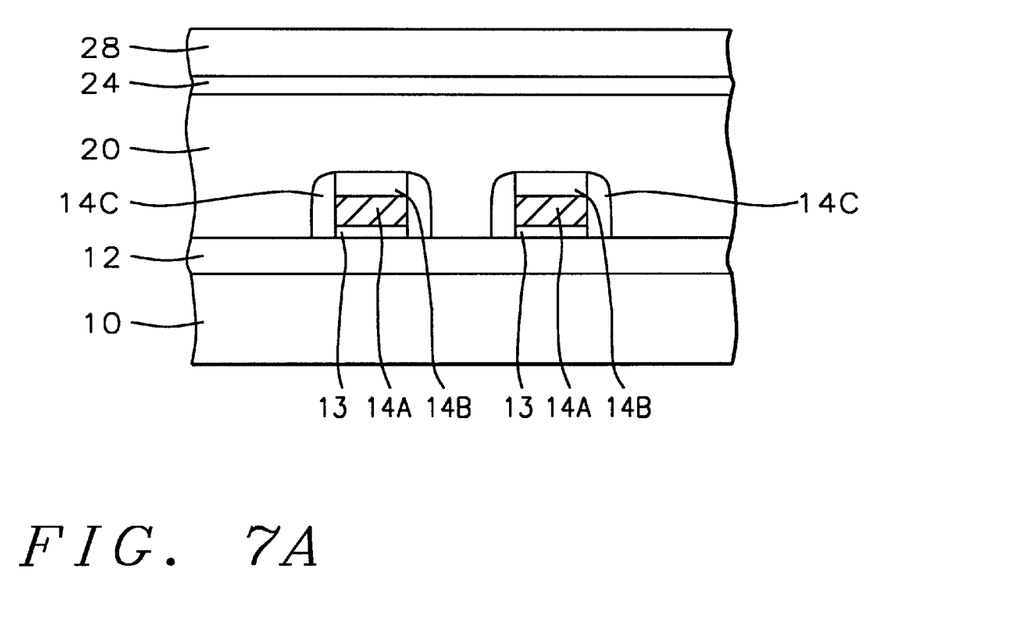
Figure 7B:
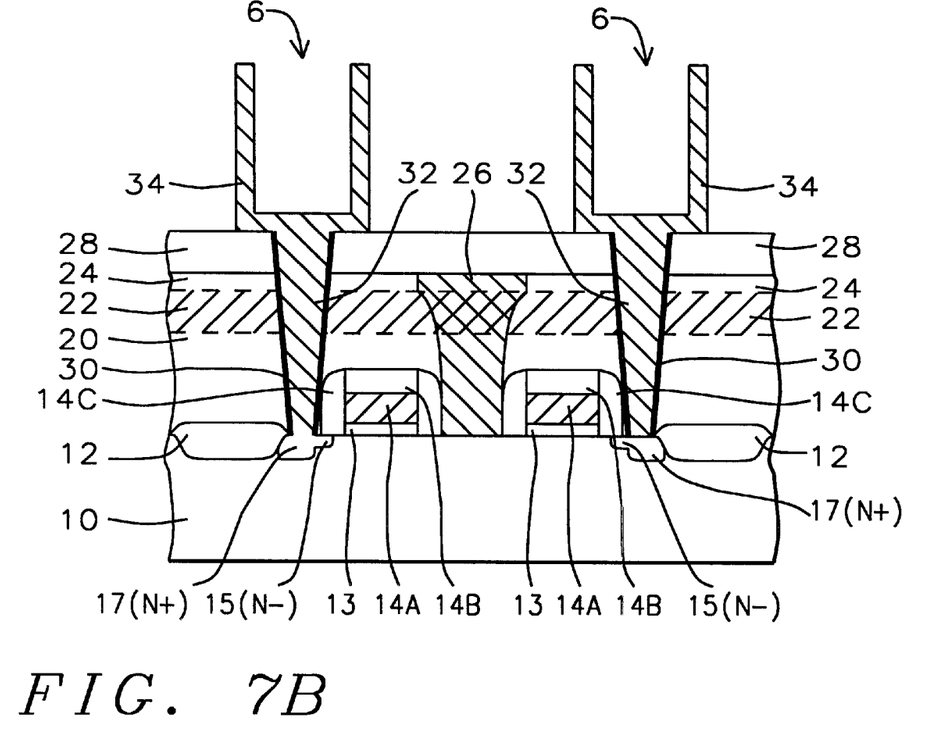
Figure 7C:
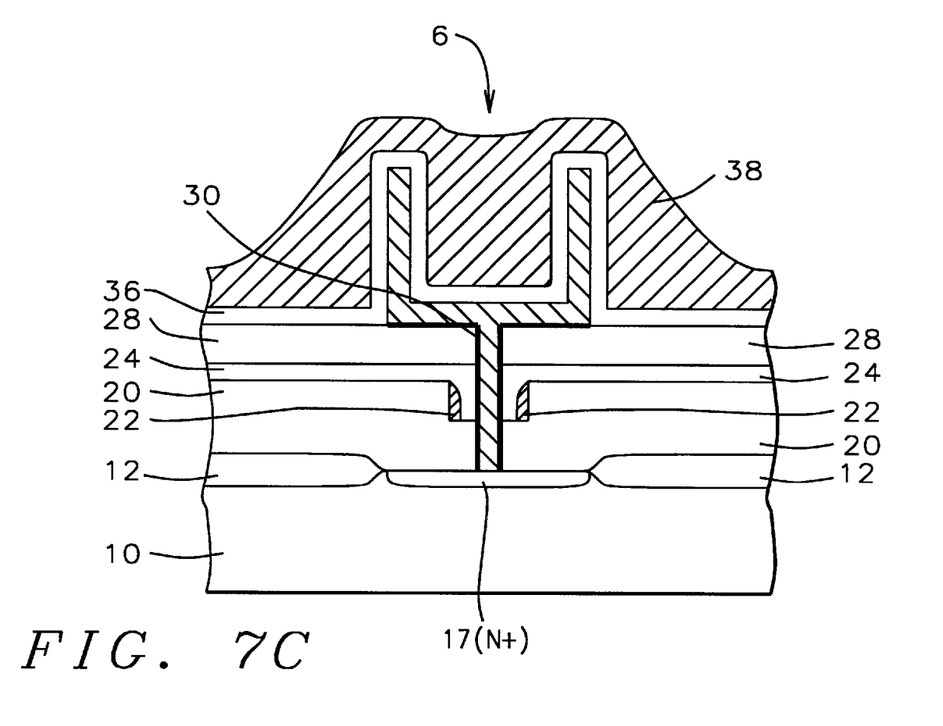

Referring to FIGS. 7A through 7D, conventional photolithographic techniques and anisotropic plasma etching are used to etch openings 6 to form capacitor node contact openings. The openings 6 are etched in the third, second, and first insulating layers, 28, 24, and 20, respectively, aligned over and between the sidewall-spacer bit lines 22 and to the second of the source/drain contact areas 17($N^+$), as shown in FIGS. 7B and 7C, and in the top view of FIG. 2.

Still referring to FIGS. 7A through 7D, a thin conformal fourth insulating layer 30 is deposited over the third insulating layer 28 and in the node contact openings 6, as shown in FIGS. 7B and 7C. Layer 30 is preferably composed of $Si_3N_4$, deposited by LPCVD to a preferred thickness of between about 100 and 300 Angstroms. Layer 30 is then an-isotropically etched back to form insulating sidewalls 30 on any exposed sidewall-spacer bit lines 22 in the node contact openings 6.

Figure 7D:
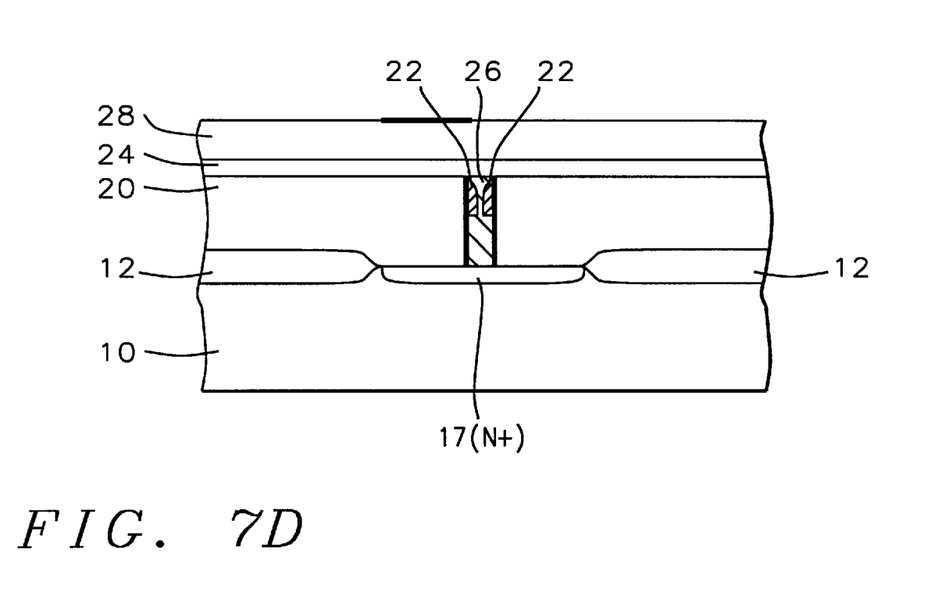

A fourth conducting layer 32 is deposited to fill the node contact openings 6 to form node contacts 32 to the second of the source/drain contact areas 17($N^+$). Layer 32 is preferably $N^+$ doped polysilicon. For example, the polysilicon can be deposited by LPCVD using $SiH_4$ as the reactant gas, and in-situ doped with $PH_3$ during deposition to a preferred concentration of between about 1.0 E 19 and 1.0 E 21 atoms/$cm^3$. Layer 32 is deposited to a thickness sufficient to fill the node contact openings 6, and preferably to a thickness greater than 1000 Angstroms. The polysilicon layer 32 is then etched back or chemically/mechanically polished back to form the capacitor node contacts 32, as depicted in FIGS. 7C and 7D. For example, the etch-back can be performed using RIE and an etchant gas that etches polysilicon selectively to $SiO_2$. Because of the self-aligning technique of this invention using sidewall-spacer bit lines 22 the active area (AA) of the memory cell can be scaled to the minimum feature size F (e.g. AA=2FX3F) and the packing density for the memory cells can be increased.

Still referring to FIGS. 7A through 7D, the DRAM memory cells can now be completed using conventional means to form stacked capacitors over the node contacts 32. The stacked capacitors shown in FIGS. 7B and 7C are for a crown-shaped capacitor structure. However, other capacitor structures such as fin-shaped, double-crown, and the like can also be formed. A polysilicon layer 34 is deposited and patterned to form the crown-shaped bottom electrodes 34 for the capacitors. Layer 34 is deposited by LPCVD and is heavily doped with phosphorus to a concentration of between about 1.0 E 19 and 1.0 E 21 atoms/$cm^3$. A thin interelectrode dielectric layer 36 having a high dielectric constant is deposited on the surface of the bottom electrodes 34. The dielectric layer 36 is can be composed of $SiO_2$/$Si_3N_4$/$SiO_2$ (ONO). The ONO dielectric is formed by growing a thermal oxide on the polysilicon bottom electrodes, depositing a $Si_3N_4$ layer by LPCVD, and then using an oxidation furnace to form the top $SiO_2$ by partially reducing the $Si_3N4$ layer. Preferably the ONO is formed having a thickness of between about 52 and 60 Angstroms. Alternatively, layer 36 can be composed of other high-dielectric constant materials, such as tantalum pentoxide ($Ta_2O_5$) or can be used in conjunction with ONO to form the high-dielectric-constant layer 36. The capacitor top electrodes are then formed by depositing and patterning a polysilicon layer 38. The polysilicon layer is also deposited by LPCVD using a reactant gas such $SiH_4$ and doped with phosphorus using $PH_3$ to a concentration of between about 1.0 E 19 and 1.0 E 21 atoms/$cm^3$. The thickness of layer 38 is generally between about 800 and 1600 Angstroms.

While the invention has been particularly shown and described with reference to the preferred embodiment thereof, it will be understood by those skilled in the art that various changes in form and details may be made without departing from the spirit and scope of the invention.

What is claimed is:

1. Dynamic random access memory (DRAM) cells with minimum memory cell areas on a semiconductor substrate, comprised of:

providing a semiconductor substrate having said memory cell areas surrounded by field oxide regions;

a patterned first electrically conducting layer that forms word lines extending over said cell areas to form gate electrodes for field effect transistors, and further having first and second source/drain areas, one on each side and adjacent to said gate electrodes;

a planar first insulating layer on said substrate having trenches aligned over and orthogonal to said gate electrodes and extending over said first and second source/drain areas, the width of said trenches lying within said memory cell areas;

conducting sidewall spacers formed on sidewalls of said trenches to provide sidewall-spacer bit lines, and said trenches filled with a second insulating layer sufficiently thick to fill said trenches between said sidewall-spacer bit lines, and said second insulating layer having a planar surface;

said second and first insulating layer having bit line contact openings aligned over and between said sidewall-spacer bit lines and etched to said first source/drain areas and filled with a third conducting layer to provide bit line contacts;

a third insulating layer on said second insulating layer, and said third, second, and first insulating layers having capacitor node contact openings between said sidewall-spacer bit lines to said second source/drain contact areas in each of said cell areas;

a conformal fourth insulating layer in said node contact openings to insulate said sidewall-spacer bit lines; and said node contact openings filled with a fourth conducting layer to form node contacts and providing storage capacitors to complete said DRAM cells.

2. The structure of claim 1, wherein said trenches have a width of less than 2F, where F is the minimum feature size of a photoresist mask used to etch said trenches.

3. The structure of claim 1, wherein said DRAM cells share common bit line contacts.

4. The structure of claim 1, wherein said first electrically conducting layer is a polycide layer.

5. The structure of claim 1, wherein said second third, and fourth conducting layers are polysilicon doped with an N-dopant to a concentration of between about 1.0 E 19 and 1.0 E 21 atoms/$cm^3$.

6. The structure of claim 1, wherein said trenches in said first insulating layer have a depth of between about 500 and 2000 Angstroms.

* * * * *